United States Patent [19]

Koike

[11] Patent Number: 5,187,385
[45] Date of Patent: Feb. 16, 1993

[54] LATCH CIRCUIT INCLUDING FILTER FOR METASTABLE PREVENTION

[75] Inventor: Hideharu Koike, Yokohama, Japan

[73] Assignee: Kabushiki Kaisha Toshiba, Kawasaki, Japan

[21] Appl. No.: 744,835

[22] Filed: Aug. 13, 1991

Related U.S. Application Data

[63] Continuation of Ser. No. 162,149, Feb. 29, 1988, abandoned.

[51] Int. Cl.[5] .................... H03K 3/284; H03K 3/286; H03K 17/16
[52] U.S. Cl. ................. 307/272.1; 307/443; 307/234; 307/272.2; 328/111
[58] Field of Search ........... 307/234, 246, 279, 272.1, 307/272.2, 289, 265, 291, 443; 328/111

[56] References Cited

U.S. PATENT DOCUMENTS

| | | | |
|---|---|---|---|
| 3,786,276 | 1/1974 | Rösch | 307/272.2 |
| 3,786,282 | 1/1974 | Orndorff | 307/272.2 |
| 3,835,336 | 9/1974 | Block | 307/234 |
| 3,970,944 | 7/1976 | Huellwegen | 307/234 |
| 4,051,389 | 9/1977 | Kaneko et al. | 307/291 |
| 4,061,976 | 12/1977 | Sugai | 307/234 |
| 4,093,878 | 6/1978 | Paschal et al. | 307/291 |
| 4,160,173 | 7/1979 | Aoki | 307/291 |
| 4,233,525 | 11/1980 | Takahashi et al. | 307/234 |
| 4,495,628 | 1/1985 | Zasio | 307/272.2 |
| 4,495,629 | 1/1985 | Zasio et al. | 307/272.2 |
| 4,506,165 | 3/1985 | Gulati et al. | 307/272.2 |
| 4,575,644 | 3/1986 | Leslie | 307/291 |
| 4,591,737 | 5/1986 | Campbell | 307/272.1 |
| 4,599,736 | 7/1986 | Hoppe | 307/234 |
| 4,716,318 | 12/1987 | Koike | 307/520 |

FOREIGN PATENT DOCUMENTS 0184350 6/1986 European Pat. Off. .
WO84/03012 8/1984 PCT Int'l Appl. .

OTHER PUBLICATIONS

Diehl et al., "Considerations for Single Event Immune VLSI Logic" IEEE Transactions on Nuclear Science, vol. NS-30, No. 6, Dec. 1983.

Jenkins et al., "Metastability Resolution Latch" IBM Technical Disclosure Bulletin, vol. 23, No. 12, May 1981.

*Primary Examiner*—Timothy P. Callahan
*Attorney, Agent, or Firm*—Foley & Lardner

[57] ABSTRACT

The latch circuit comprises a data hold circuit comprising a closed loop circuit formed by an even number of stages of logic gates connected in series. The data hold circuit accepts data when a clock signal is received and holds this data until a next clock signal is received. A filter is provided for eliminating pulses generated in the closed loop circuit. The filter is formed of logic gates.

8 Claims, 5 Drawing Sheets

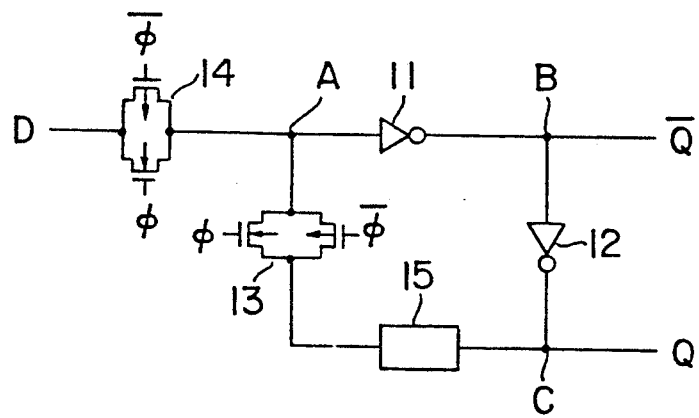
F I G. 2
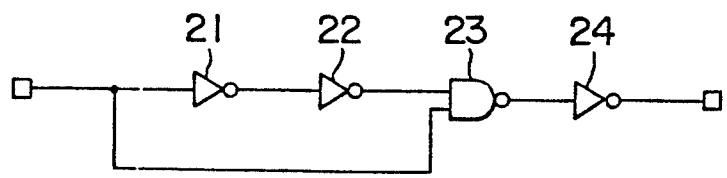
F I G. 3
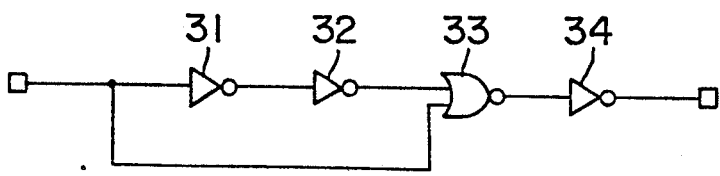
F I G. 4

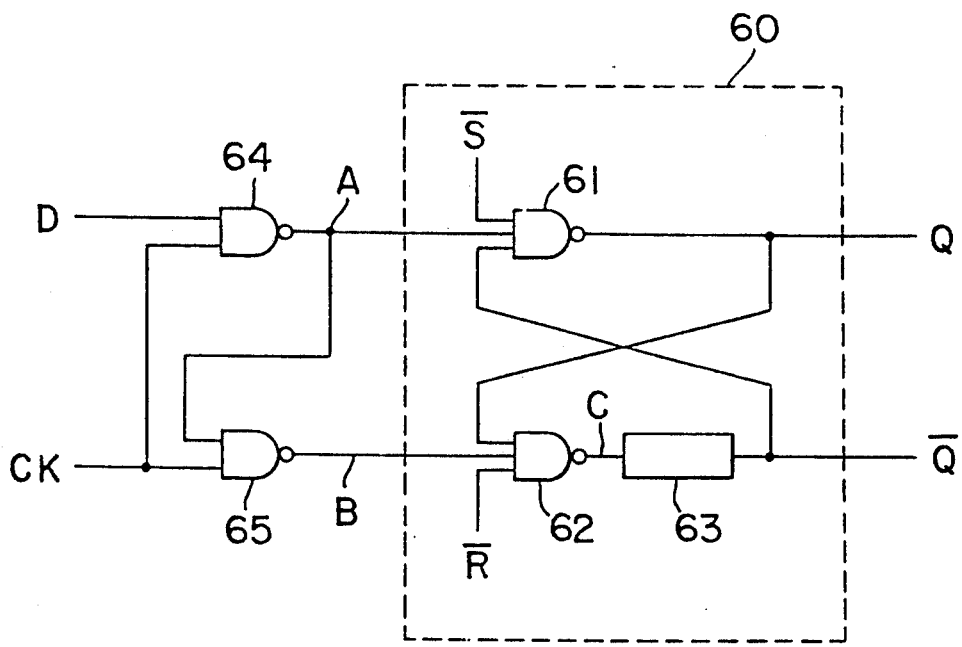
F I G. 12
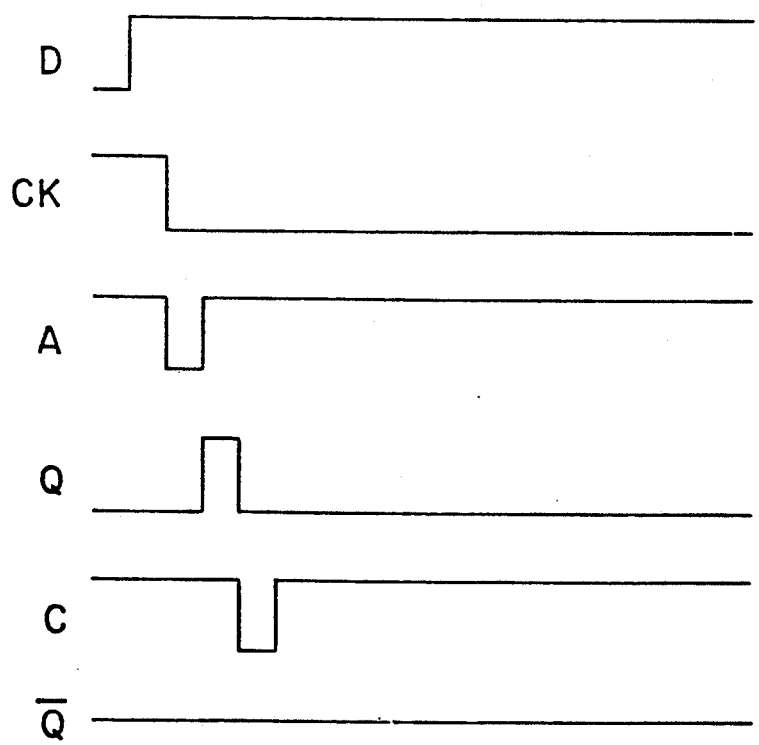
F I G. 13

LATCH CIRCUIT INCLUDING FILTER FOR METASTABLE PREVENTION

This application is a continuation of application Ser. No. 07/162,149, filed Feb. 29, 1988, now abandoned.

BACKGROUND OF THE INVENTION

This invention relates to a latch circuit, and more particularly to a latch circuit used for synchronizing an asynchronous signal.

For circuits to maintain the previous data status, latch circuits of the closed loop configuration are known. Especially, D-type latch circuits are well known.

FIG. 1 shows a well known D flip-flop suitable for CMOS configuration, etc. In this circuit, two NAND gates 2 and 3 are provided in order to control the operation of a clocked RS flip-flop comprised of two NAND gates serially closed-loop connected by the D input of the NAND gate 2. This circuit enters into the operational condition in response to the rise of a clock pulse to hold Q equal to D at the time of the fall thereof until the next clock signal, thus to hold, i.e., delay input data by one clock cycle.

With such a conventional circuit, where data and clock signal change substantially at the same time, there is the possibility that oscillation is produced in the latch circuit. Such a phenomenon is often observed in an input circuit to which an asynchronous signal or the like is incoming which is called "metastable phenomenon". In such a metastable phenomenon, the output of the latch circuit continues for about several tens of ns with it being indefinite, resulting in instability of the circuit operation.

Accordingly, it is required to avoid the influence of the metastable phenomenon to delay the time for taking out an output until the output of the latch is completely stabilized. This makes it difficult to operate the circuit at a high speed.

SUMMARY OF THE INVENTION

Therefore, an object of this invention is to provide a latch circuit of which operation is early stabilized.

In accordance with this invention, a latch circuit is provided which comprises data hold means in which a closed loop circuit is formed by even stages of logic gates connected in series, and for taking thereinto data existing when a clock signal is input to hold the data until a next clock signal is given, and filter means for eliminating a pulse generated within the closed loop circuit.

When such a configuration is employed, since it is considered that the metastable phenomenon is principally based on the fact that pulse having a very short period continues being propagated within the closed loop circuit, such a short period pulse is eliminated by the filter means, thereby reducing unstable time. This makes it possible to perform the operation as the entirety of the circuit at a high speed.

Preferred embodiments will be more apparent with reference to the accompanying drawings.

BRIEF DESCRIPTION OF THE DRAWINGS

In the accompanying drawings:

FIG. 2 is a circuit diagram showing an embodiment of this invention;

FIGS. 3 and 4 are circuit diagrams showing examples of low pass filter used in this embodiment, respectively;

FIG. 12 is a circuit diagram showing an embodiment in which this invention is applied to a D latch circuit; and FIG. 13 is a timing chart showing the operation of the embodiment in FIG. 12.

DESCRIPTION OF THE PREFERRED EMBODIMENT

Figure 1:
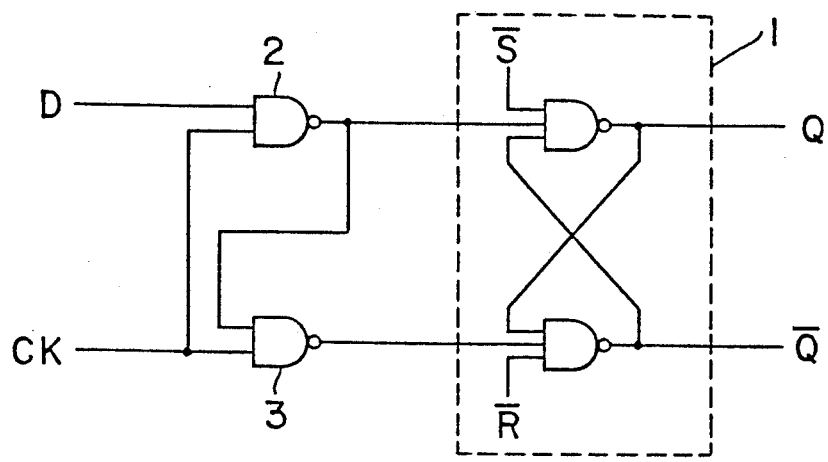
FIG. 1 is a circuit diagram showing a conventional typical D latch circuit.

Various embodiments of this invention will be described in detail with reference to the accompanying drawings.

FIG. 2 is a circuit diagram showing an embodiment of this invention. A transmission gate 14 driven by a clock signal is connected to the D input terminal. This transmission gate is composed of an n type transistor to which a clock signal is supplied and a p type transistor to which an inverted clock signal is supplied. At the node A on the output side of the transmission gate 14, a data hold circuit comprised of loop-connected inverters 11 and 12 is provided. The output side of the inverter 12 is connected to the input side (node A) of the inverter 11 through a low pass filter 15 and a transmission gate 13 driven by the clock signal. The junction or node B of the inverters 11 and 12 serves as the output $\overline{Q}$, and the junction or node C of the inverter 12 and the low pass filter 15 serves as the output Q.

FIGS. 3 and 4 show typical circuit examples of the low pass filter 15, respectively. The low pass filter circuit shown in FIG. 3 is composed of a NAND gate 23 which receives an input as it is and an input through two stages of inverters 21 and 22 which are series-connected, and an inverter 24 for inverting the output of the NAND gate 23. On the other hand, the low pass filter circuit shown in FIG. 4 is composed of a NOR gate 33 which receives an input as it is and an input through two stages of inverters 31 and 32 which are series-connected, and an inverter 34 for inverting the output of the NOR gate 33. These two stages of inverters 21 and 22, and 31 and 32 determine respective delay time. Infinitesimal pulses produced after a signal on the input terminal has changed are delayed by such a delay time, thereby to be neglected because logical multiplication or logical sum is not held by the NAND or NOR gate. Thus, these circuits eliminate a pulse having a period shorter than that of the delay time of the closed loop circuit and have a function of the low pass filter. It is to be noted that the series inverter circuits can have an arbitrary even number of stages in conformity with a cutoff frequency. Accordingly if the propagation delay time thereof becomes longer, the set up time of the latch circuit also becomes longer. For example, when the propagation delay time is about 3 ns, the set up time is set about 4 ns.

Figure 5:
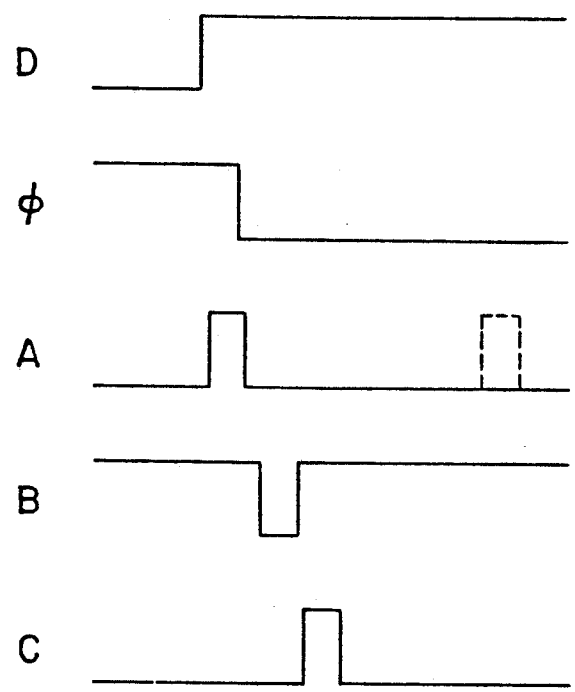
FIGS. 5 and 6 are timing charts showing the operation of the embodiment in FIG. 2.
Figure 6:
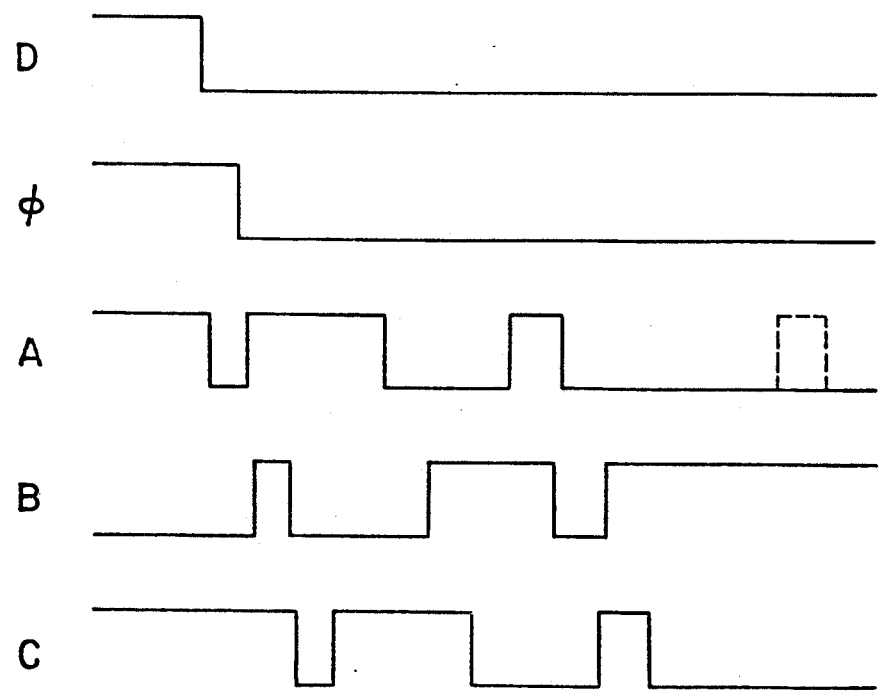

FIGS. 5 and 6 are timing charts showing the operation of the latch circuit shown in FIG. 2 wherein the signal waveforms on respective nodes A, B and C in FIG. 2 when the low pass filter shown in FIG. 3 is used are shown.

Assuming that the D input rises and the clock signal ϕ falls whereby a pulse shown in FIG. 5 is produced on the node A, this pulse is inverted and delayed by the inverter 11, thus to appear on the node B. Further, the pulse is inverted and delayed by the inverter 12, thus to appear on the node C. However, this pulse is absorbed by the low pass filter 15, resulting in no possibility that a pulse indicated by broken lines appears again on the node A. In other words, high frequency component of the input signal is cut off, whereby the oscillation is prevented.

FIG. 6 shows that a negative pulse is produced on the node A in response to the fall of the D input. This pulse is propagated through the nodes B and C in succession. In addition, a positive pulse subsequent to this pulse is also propagated, but its pulse width is decreased every time when it passes through the low pass filter 15. In a short time, there occurs the state where oscillation pulse does not appear on the node A, so that the output on the node A is stabilized.

Figure 7:
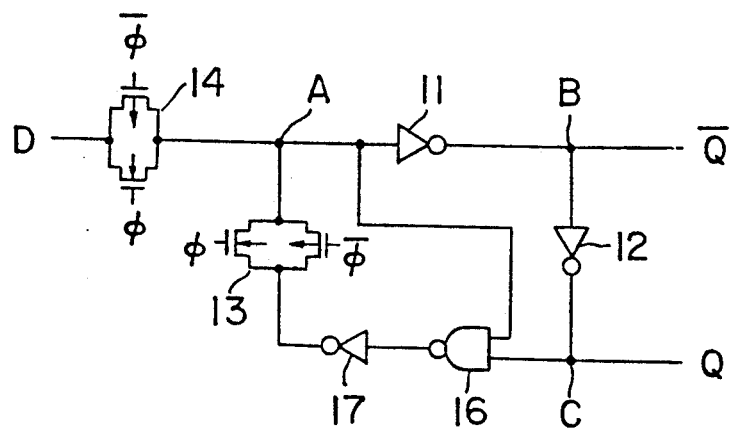
FIG. 7 is a circuit diagram showing another embodiment of this invention.

FIG. 7 is a circuit diagram showing another embodiment of this invention. Two inverters 11 and 12 which constitute the latch circuit and two transmission gates 13 and 14 are the same as those in FIG. 1, but a NAND gate 16 which receives signals on the nodes A and C and an inverter 17 for inverting the output of the NAND gate 16 are provided for a low pass filter. In such a configuration, two inverters 11 and 12 constituting the latch circuit correspond to the two inverters 21 and 22 in FIG. 3, thus making it possible to reduce the number of elements as a whole by using logic elements in common.

Figure 8:
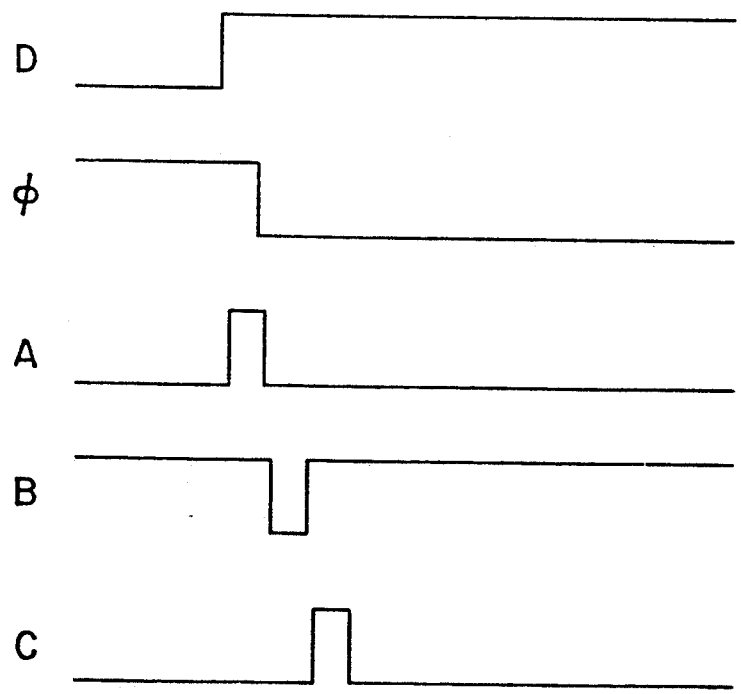
FIG. 8 is a timing chart showing the operation of the embodiment in FIG. 7.

FIG. 8 is a timing chart showing the function of preventing oscillation in FIG. 7. A pulse on the node A produced due to the fact that the rise of the D input and the fall of the clock signal Φ are close to each other in time is propagated to the node C while being delayed by the inverters 11 and 12. However, since the nodes A and C do not become high level together, this pulse is not propagated beyond the NAND gate 16. Thus, oscillation is prevented.

Figure 9:
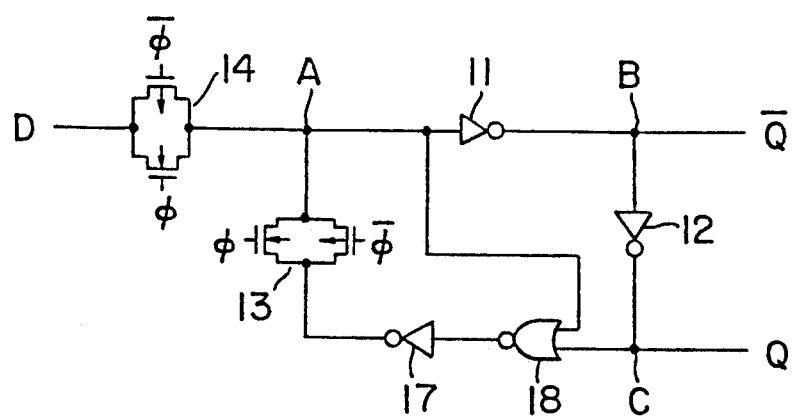
FIG. 9 is a circuit diagram showing a further embodiment of this invention.

FIG. 9 is a circuit diagram showing an embodiment similar to that in FIG. 6. This embodiment is characterized in that the NAND gate 16 in FIG. 7 is changed to a NOR gate 18. Also in this embodiment, two inverters 11 and 12 constituting the latch circuit are used so as to serve to form delay in the low pass filter, thus making it possible to reduce the number of elements.

Figure 10:
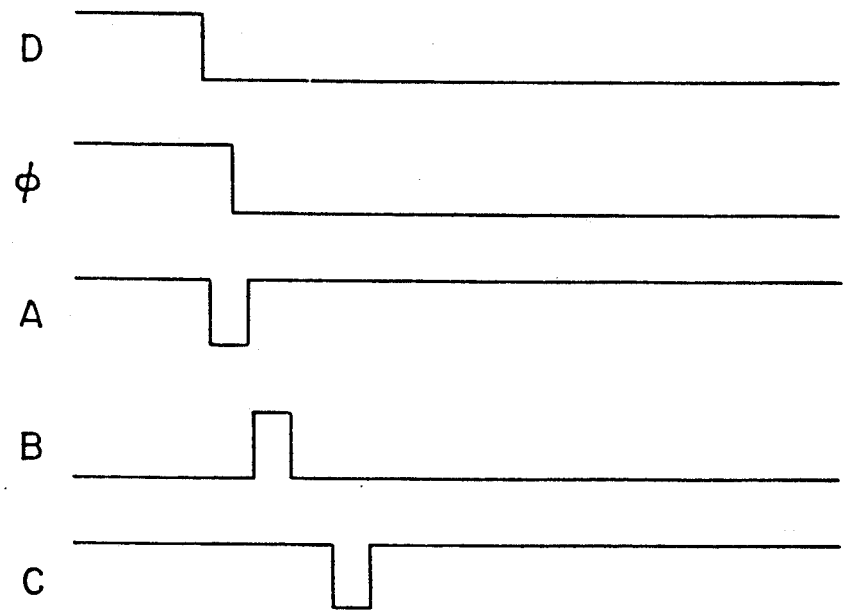
FIG. 10 is a timing chart showing the operation of the embodiment in FIG. 9.

FIG. 10 is a timing chart showing the operation of the circuit shown in FIG. 9. A pulse produced on the node A when the D input falls from H to L is prevented from being propagated by the inverters 11 and 12 and the NOR gate 18. Thus, early stabilization of the operation can be realized.

Figure 11:
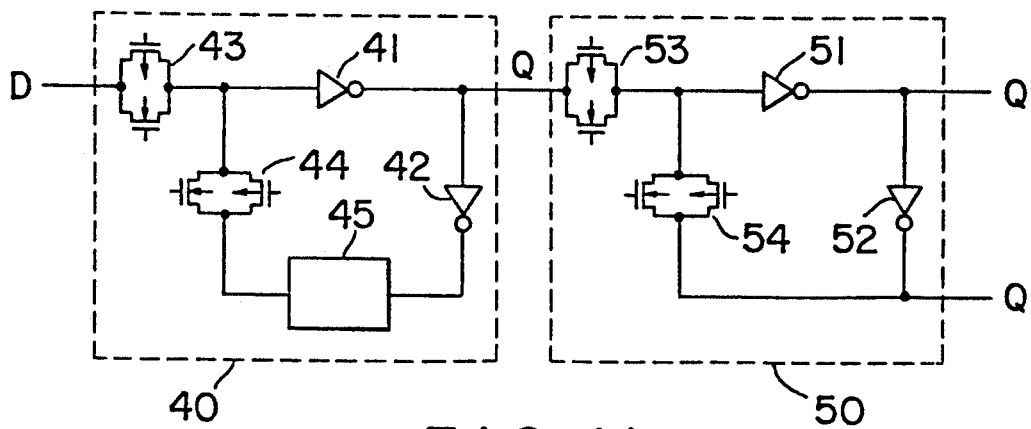
FIG. 11 is a circuit diagram showing an embodiment in which this invention is applied to a master-slave latch circuit.

FIG. 11 is a circuit diagram showing a further embodiment of this invention wherein there is shown a latch circuit of the master-slave type in which one of two latch circuits is restricted by the output of the other circuit. In this latch circuit, Q output of the master latch 40 serves as D input of the slave latch 50. Both latches include two inverters 41 and 42, and 51 and 52, and two transmission gates 43 and 44, and 53 and 54, respectively. Between the inverter 42 and the transmission gate 44 on the side of the master latch, a low pass filter 45 is provided.

With such a latch circuit, an infinitesimal pulse produced in the master latch is cut off by the low pass filter, so that the slave latch becomes operative by the stabilized Q output. Accordingly, the master-slave operation is ensured. It is to be noted that while a low pass filter is not provided in the latch on the slave side in the embodiment in FIG. 11, a similar low pass filter may be provided between the inverter 52 and the transmission gate 54 according to need.

In the above-mentioned embodiments, latch circuits including two inverters connected in series as a basic configuration have been assumed. However, the number of inverters is not limited to two. Even number of inverters may be used for this purpose. In addition, any logic gate may be used as long as it includes inversion. For example, NAND or NOR may be suitably used.

FIG. 12 shows a still further embodiment of this invention wherein this invention is applied to the D flip-flop circuit shown in FIG. 1. This circuit is provided with NAND gates 64 and 65 in order to control the operation of a RS flip-flop 60 by the value of the D input of the D flip-flop circuit including the above-mentioned NAND gates 64 and 65. The RS flip-flop 60 comprises two NAND gates 61 and 62 which are connected in closed loop in series and having set and reset inputs, respectively. The D flip-flop comprises the NAND gate 64 having inputs for receiving data and clock signal, respectively, and the NAND gate 65 having inputs for receiving clock signal and output of the NAND gate 64, respectively. The output of the NAND gate 62 is input to the NAND gate 61 via a filter circuit 63.

The operation of this circuit is shown by the timing chart in FIG. 13. Assuming that data rises immediately before the clock CK falls, a negative pulse is observed on the node A. In this instance, if the filter 63 is not connected, the negative pulse on the node A is propagated through two NAND gates in succession, whereby inversion of the state continues, resulting in occurrence of oscillation.

On the contrary, when the filter 63 is inserted between NAND circuits 62 and 61, such a pulse is absorbed after it has passed through the node C, with the result that it does not appear as $\overline{Q}$ output.

In this case, for the filter 63, the NAND type filter shown in FIG. 3, the NOR type filter shown in FIG. 4, or the like may be used.

In accordance with this invention, since the filter means for eliminating a pulse having a period shorter than that of a time from occurrence of clock signal to the time until the data is ordinarily stabilized is provided within the closed loop circuit for holding data, short period pulses produced as a result of the fact that data and clock signal change substantially at the same time are not propagated circularly within the looped circuit. As a result, oscillation is prevented, thus making it possible to prevent metastable phenomenon. Thus, early stabilization of the circuit operation can be realized.

What is claimed is:
1. A latch circuit comprising;
data hold means for accepting data upon receipt of a clock signal and for holding said data until receipt of a next clock signal, said data hold means comprising an even number of logic gates, as main active elements of said data hold means, connected in series in a closed loop; and filter means for eliminating a pulse generated within said closed loop, said filter means comprising at least some of said logic gates of said data hold means.

2. A latch circuit as in claim 1, wherein
said pulse generated within said closed loop has a period shorter than a total delay time of said closed loop.

3. A latch circuit as in claim 1, wherein
said filter means is a low pass filter including an inverter train having an even number of inverters;
said logic gates of said data hold means are inverters; and
said inverters of said inverter train are common with said inverters of said data hold means.

4. A latch circuit as in claim 3, wherein
said filter means includes a multiple input logic gate having one input connected to an output of said inverter train and having another input connected to an input of said inverter train; and
said one of said logic gates is common with one of said inverters of said inverter train.

5. A latch circuit comprising:
a plurality of stages of data hold means connected in series, a leading stage of said stages functioning as a master stage and a subsequent stage of said stages functioning as a slave stage;
each of said data hold means comprising a closed loop formed by an even number of logic gates, as main active elements of said data hold means, for accepting data when a clock signal is received and for holding said data until a next clock signal is received; and
filter means, located in at least said master stage, for eliminating a pulse generated in said closed loop of said data hold means of said master stage, said filter means of said master stage comprising at least some of said logic gates of said data hold means of said master stage.

6. A latch circuit as in claim 5, further including:
a transmission gate for selectively passing said data to said plurality of stages of data hold means, said transmission gate being controlled by said clock signal.

7. A latch circuit as in claim 5, wherein
said filter means is a low pass filter including an inverter train having an even number of inverters;
said logic gates of said data hold means are inverters; and
said inverters of said logic train comprise said inverters of said data hold means used in common.

8. A latch circuit as in claim 7, wherein
said filter means includes a multiple input logic gate having one input connected to an output of said inverter train and having another input connected to an input of said inverter train;
said one of said logic gates is common with one of said inverters of said inverter train.

* * * * *